(12) United States Patent
Tamada et al.

(10) Patent No.: US 10,591,563 B2
(45) Date of Patent: Mar. 17, 2020

(54) MAGNETIC RESONANCE IMAGING APPARATUS

(71) Applicant: Toshiba Medical Systems Corporation, Otawara-shi (JP)

(72) Inventors: Daiki Tamada, Nakakoma (JP); Takashi Watanabe, Yokohama (JP)

(73) Assignee: Canon Medical Systems Corporation, Otawara-shi (JP)

( * ) Notice: Subject to any disclaimer, the term of this patent is extended or adjusted under 35 U.S.C. 154(b) by 39 days.

(21) Appl. No.: 15/789,207

(22) Filed: Oct. 20, 2017

(65) Prior Publication Data

US 2018/0306881 A1 Oct. 25, 2018

(30) Foreign Application Priority Data

Apr. 21, 2017 (JP) ................................. 2017-084137

(51) Int. Cl.
| | | |
|---|---|---|
| *G01V 3/00* | (2006.01) | |
| *G01R 33/54* | (2006.01) | |
| *G01R 33/56* | (2006.01) | |
| *G01R 33/567* | (2006.01) | |
| *G01R 33/561* | (2006.01) | |
| *G01R 33/50* | (2006.01) | |

(52) U.S. Cl.
CPC ............ *G01R 33/54* (2013.01); *G01R 33/50* (2013.01); *G01R 33/561* (2013.01); *G01R 33/5602* (2013.01); *G01R 33/5676* (2013.01)

(58) Field of Classification Search
CPC .. A61B 5/055; G01R 33/4828; G01R 33/543; G01R 33/5608; G01R 33/50

USPC ........................................................ 324/318
See application file for complete search history.

(56) References Cited

U.S. PATENT DOCUMENTS

| | | | | |
|---|---|---|---|---|
| 5,908,386 A | * | 6/1999 | Ugurbil ............ | G01R 33/56341 324/306 |
| 2008/0111547 A1 | * | 5/2008 | Alsop ................ | G01R 33/5615 324/309 |

(Continued)

FOREIGN PATENT DOCUMENTS

JP 2012-95891 5/2012

OTHER PUBLICATIONS

Xiao Chen et al. "Multi-shot Magnetic Resonance Fingerprinting using Saturation Recovery Preparation Pulse," International Society of Magnetic Resonance of Medicine (ISMRM), No. 4297, 2016, pp. 3.

(Continued)

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A magnetic resonance imaging apparatus according to the present embodiment includes sequence control circuitry and processing circuitry. The sequence control circuitry controls execution of a pulse sequence which includes a first segment and a second segment being provided prior to the first segment. The first segment is where signal acquisition is performed. The second segment is where longitudinal magnetization and transverse magnetization are reduced by applying a plurality of RF magnetic field pulses while changing a magnitude and/or a phase thereof and a plurality of spoiler gradient field pulses.

10 Claims, 8 Drawing Sheets

(56) References Cited

U.S. PATENT DOCUMENTS

| | | | | |
|---|---|---|---|---|
| 2012/0019244 | A1* | 1/2012 | Chen | G01R 33/5602 |
| | | | | 324/309 |
| 2013/0193972 | A1* | 8/2013 | Kitane | G01R 33/4818 |
| | | | | 324/318 |
| 2015/0272453 | A1* | 10/2015 | Heberlein | A61B 5/0263 |
| | | | | 600/419 |
| 2015/0302297 | A1* | 10/2015 | Griswold | G01R 33/5608 |
| | | | | 706/23 |

OTHER PUBLICATIONS

Thomas Amthor et al. "Steady-State Magnetic Resonance Fingerprinting," International Society of Magnetic Resonance of Medicine (ISMRM), No. 4225, 2016, pp. 2.

* cited by examiner

MAGNETIC RESONANCE IMAGING APPARATUS

CROSS-REFERENCE TO RELATED APPLICATIONS

This application is based upon and claims the benefit of priority from the prior Japanese Patent Application No. 2017-084137, filed Apr. 21, 2017, the entire contents of which are incorporated herein by reference.

FIELD

Embodiments described herein relate generally to a magnetic resonance imaging apparatus.

BACKGROUND

Magnetic Resonance Fingerprinting (MRF) is known as a method for estimating a quantitative value which is a value of an MR parameter such as T1 or T2. In MRF, a quantitative value is estimated by dictionary matching between a signal value waveform of consecutive MR signals and a signal value waveform obtained by simulation (predictive calculation).

DETAILED DESCRIPTION

A magnetic resonance imaging apparatus according to the present embodiment includes sequence control circuitry and processing circuitry. The sequence control circuitry controls execution of a pulse sequence which includes a first segment and a second segment being provided prior to the first segment. The first segment is where signal acquisition is performed. The second segment is where longitudinal magnetization and transverse magnetization are reduced by applying a plurality of RF magnetic field pulses while changing a magnitude and/or a phase thereof and a plurality of spoiler gradient field pulses.

In the following descriptions, the magnetic resonance imaging apparatus according to the present embodiment will be described with reference to the drawings.

Figure 1:
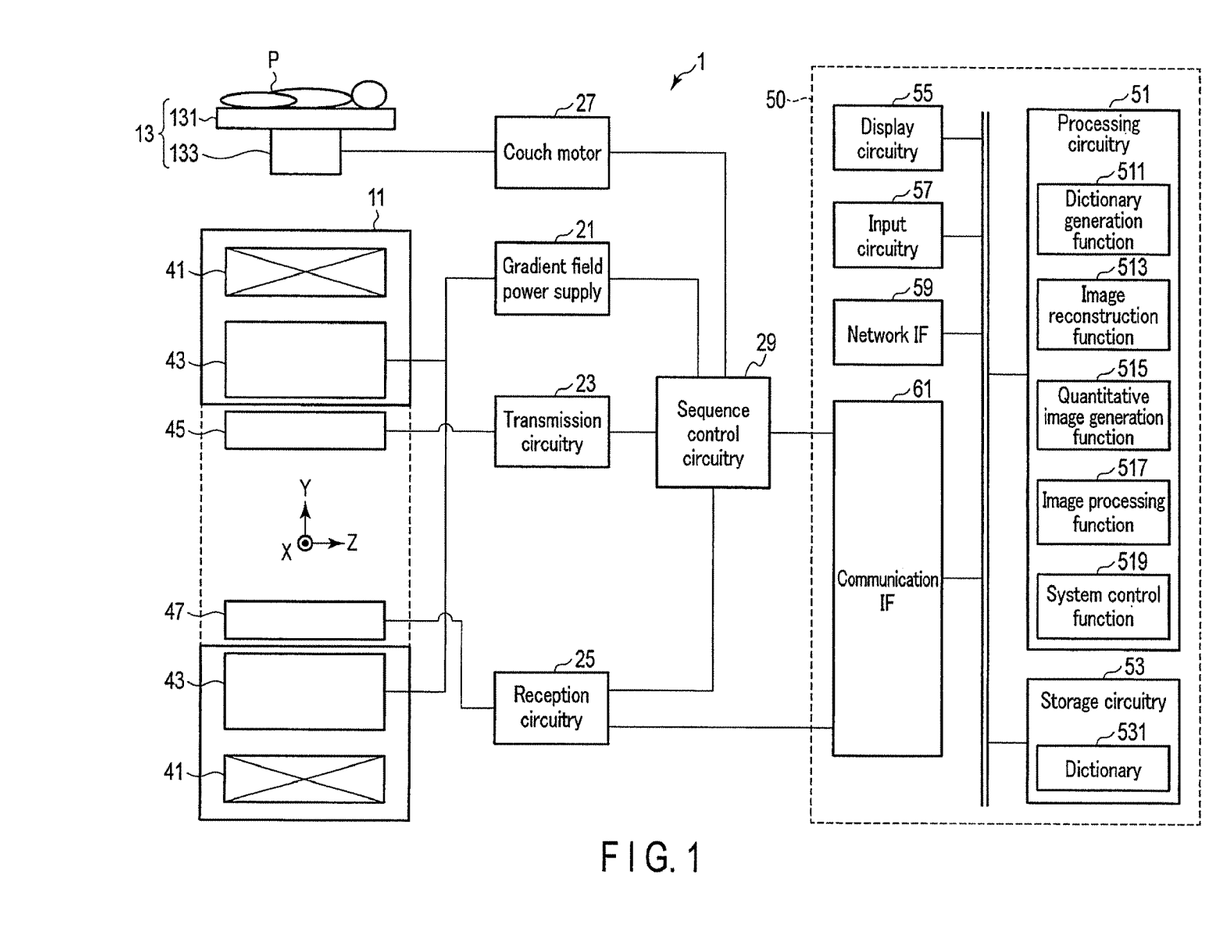
FIG. 1 is a block diagram of the configuration of a magnetic resonance imaging apparatus according to the present embodiment.

FIG. 1 is a block diagram of the configuration of a magnetic resonance imaging apparatus 1 according to the present embodiment. As shown in FIG. 1, the magnetic resonance imaging apparatus 1 includes a gantry 11, a couch 13, a gradient field power supply 21, transmission circuitry 23, reception circuitry 25, a couch motor 27, sequence control circuitry 29, and a host PC 50.

The gantry 11 includes a static field magnet 41 and a gradient field coil 43. The static field magnet 41 and the gradient field coil 43 are housed in the housing of the gantry 11. A bore having a hollow shape is formed in the housing of the gantry 11. A transmission coil 45 and a reception coil 47 are arranged in the bore of the gantry 11.

The static field magnet 41 has a hollow and essentially cylindrical shape, and generates a static magnetic field inside thereof. The static field magnet 41 uses, for example, a permanent magnet, superconducting magnet, or normal conducting magnet, etc. The central axis of the static field magnet 41 is defined as a Z axis; an axis vertically perpendicular to the Z axis is referred to as a Y axis; and an axis horizontally perpendicular to the Z axis is referred to as an X axis. The X, Y, and Z axes constitute a three-dimensional orthogonal coordinate system.

The gradient field coil 43 is a coil unit mounted inside the static field magnet 41 and formed in a hollow and essentially cylindrical shape. The gradient field coil 43 generates a gradient field upon receiving a current supplied from the gradient field power supply 21. Specifically, the gradient field coil 43 includes three coils corresponding respectively to the X, Y, and Z axes which are perpendicular to each other. The three coils generate gradient fields in which the magnetic field magnitude changes along the X, Y, and Z axes. The gradient fields along the X, Y, and Z axes are combined to generate a slice selective gradient field Gss, a phase encode gradient field Gpe, and a readout gradient field Gro, which are perpendicular to each other, in desired directions. These gradient fields are superimposed on a static magnetic field and applied to a subject P. The slice selective gradient field Gss is used to discretionarily determine an imaging slice. The phase encode gradient field Gpe is used to change the phase of MR signals in accordance with a spatial position. The readout gradient field Gro is used to change the frequency of MR signals in accordance with a spatial position. In the following description, it is assumed that the gradient direction of the slice selective gradient field Gss aligns with the Z axis, the gradient direction of the phase encode gradient field Gpe aligns with the Y axis, and the gradient direction of the readout gradient field Gro aligns with the X axis.

The gradient field power supply 21 supplies a current to the gradient field coil 43, in accordance with a sequence control signal from the sequence control circuitry 29. The gradient field power supply 21 supplies a current to the gradient field coil 43 to allow the gradient field coil 43 to generate gradient fields in the X, Y, and Z axis directions. These gradient fields are superimposed on the static magnetic field formed by the static field magnet 41 and applied to the subject P.

The transmission coil 45 is arranged inside the gradient field coil 43 and generates a high frequency magnetic field pulse (hereinafter referred to as an RF magnetic field pulse) upon receiving a Radio Frequency electric current pulse (hereinafter referred to as an RF current pulse) from the transmission circuitry 23.

The transmission circuitry 23 applies to the subject P an RF magnetic field pulse for exciting a target proton in the subject P via the transmission coil 45. The target proton is typically a proton of a hydrogen atom. Specifically, the transmission circuitry 23 includes a real channel and an imaginary channel. The real channel and the imaginary channel supply to the transmission coil 45 an RF current pulse with a center frequency, a pulse waveform, an amplitude, and a duration, in accordance with control by the sequence control circuitry 29. The transmission coil 45 includes a real coil and an imaginary coil. The real coil and the imaginary coil are arranged perpendicular to each other. The real coil and the imaginary coil each receive an RF current pulse from the transmission circuitry 23 and generate a high frequency magnetic field. The high frequency magnetic field generated by the real coil and the high frequency magnetic field generated by the imaginary coil are combined to generate an RF magnetic field pulse. The RF magnetic field pulse vibrates at a resonance frequency specific to the target protons and excites the target protons. A magnetic resonance signal (hereinafter referred to as an MR signal) is generated from an excited target proton and detected by the reception coil 47.

The reception coil 47 receives MR signals generated from the target protons in the subject P by being affected by the RF magnetic field pulse. The reception coil 47 includes a plurality of reception coil elements which can receive MR signals. The received MR signals are supplied to the reception circuitry 25 by wiring or wirelessly.

The reception circuitry 25 receives the MR signals generated from the excited target protons via the reception coil 47. The reception circuitry 25 generates digital MR signals by processing the received MR signals. The MR signals are supplied to the host PC 50 by wiring or wirelessly.

The aforementioned transmission coil 45 and reception coil 47 are merely an example. A transmission/reception coil having a transmission function and a reception function may be used. Alternatively, the transmission coil 45, the reception coil 47, and the transmission/reception coil may be combined.

Although not shown in FIG. 1, the reception coil 47 has a plurality of reception channels arranged in parallel. Each reception channel includes a reception coil element which receives MR signals and an amplifier which amplifies the MR signals, etc. MR signals are output for each reception channel. The total number of reception channels may be equal to, more than, or less than that of reception coil elements.

The couch 13 is set adjacent to the gantry 11. The couch 13 includes a table top 131 and a base 133. The subject P is placed on the table top 131. The base 133 supports the table top 131 to be slidable along each of the X, Y, and Z axes. A couch motor 27 is housed in the base 133. The couch motor 27 is controlled by the sequence control circuitry 29 to move the table top 131. The couch motor 27 may be any type of motor such as a servo motor or stepping motor, for example.

The sequence control circuitry 29 includes, as hardware resources, a processor such as a Central Processing Unit (CPU) or a Micro Processing Unit (MPU), and a memory such as a Read Only Memory (ROM) and a Random Access Memory (RAM). The sequence control circuitry 29 synchronously controls the gradient field power supply 21, the transmission circuitry 23, and the reception circuitry 25, based on pulse sequence information supplied from the host PC 50 via a communication IF 61, and captures an image of the subject P in the pulse sequence in accordance with the pulse sequence information. For example, the sequence control circuitry 29 according to the present embodiment executes a pulse sequence to set the longitudinal magnetization and transverse magnetization of each voxel within an imaging area of the subject P to zero (hereinafter referred to as a zero-magnetization sequence) prior to a pulse sequence for MR signal acquisition (hereinafter referred to as a signal acquisition sequence). The signal acquisition sequence according to the present embodiment may be a pulse sequence for acquiring MR signals for MR Fingerprinting (MRF) (hereinafter referred to as an MRF sequence), for example.

As shown in FIG. 1, the host PC 50 is a computer unit that includes processing circuitry 51, storage circuitry 53, display circuitry 55, input circuitry 57, a network IF 59, and the communication IF 61.

The processing circuitry 51 includes, as hardware resources, a processor such as a CPU, a Graphical Processing Unit (GPU), or an MPU, and a memory such as a ROM and a RAM. The processing circuitry 51 has a dictionary generation function 511, an image reconstruction function 513, a quantitative image generation function 515, an image processing function 517, and a system control function 519, implemented by executing various programs. The processing circuitry 51 may be implemented by an Application Specific Integrated Circuit (ASIC), a Field Programmable Gate Array (FPGA), a Complex Programmable Logic Device (CPLD), or a Simple Programmable Logic Device (SPLD), which implements the dictionary generation function 511, the image reconstruction function 513, the quantitative image generation function 515, the image processing function 517, and the system control function 519. The dictionary generation function 511, the image reconstruction function 513, the quantitative image generation function 515, the image processing function 517, and the system control function 519 may be implemented by a single board, or by separate boards.

By the dictionary generation function 511, the processing circuitry 51 generates a dictionary 531 used for generating a quantitative image based on MRF. The dictionary 531 includes data in which a signal value waveform is associated with each of the combinations of quantitative values of multiple types of MR parameters. The dictionary 531 is stored in the storage circuitry 53 in the form of a Lookup Table (LUT) or database. The signal value waveform represents a change in the signal value of the MR signals over time. The signal value waveform registered in the dictionary 531 is a signal value waveform obtained by simulation (predictively calculated) based on the corresponding combination of quantitative values of multiple types of MR parameters. In the following description, the signal value waveform generated by simulation is referred to as a predictive signal value waveform.

By the image reconstruction function 513, the processing circuitry 51 reconstructs an MR image associated with the subject P based on the MR signals acquired by the reception circuitry 25 in the signal acquisition sequence such as the MRF sequence. For example, the processing circuitry 51 reconstructs an MR image by executing to the MR signals a two dimensional inverse Fourier transform relative to a phase encode axis and a frequency encode axis.

By the quantitative image generation function 515, the processing circuitry 51 specifies a predictive signal value waveform approximated to a signal value waveform based on the MR signals acquired by the reception circuitry 25 in the MRF sequence (hereinafter referred to as a measured signal value waveform) from the dictionary 531, and allocates the quantitative values of the MR parameters associated with the predictive signal value waveform to image elements to generate an image indicating a spatial distribution of quantitative values of the MR parameters (hereinafter referred to as a quantitative image).

By the image processing function 517, the processing circuitry 51 performs various image processing to an MR image or a quantitative image. For example, the processing circuitry 51 executes image processing such as volume rendering, surface volume rendering, image value projection processing, Multi-Planer Reconstruction (MPR), Curved MPR (CPR), etc.

By the system control function 519, the processing circuitry 51 controls the entire magnetic resonance imaging apparatus 1 according to the present embodiment.

The storage circuitry 53 is a storage device such as a Hard Disk Drive (HDD), a Solid State Drive (SSD), or an integrated circuit storage device, etc. which stores various types of information. The storage circuitry 53 may be a driving device, etc. which reads and writes various types of information relative to a portable storage medium such as a CD ROM drive, a DVD drive, or a flash memory. For example, the storage circuitry 53 stores the dictionary 531 generated by the dictionary generation function 511. The storage circuitry 53 stores an MR image, a quantitative image, various programs, etc.

The display circuitry 55 displays various information. For example, the display circuitry 55 displays an MR image reconstructed by the image reconstruction function 513, a quantitative image generated by the quantitative image generation function 515, and a display image generated by the image processing function 517. The display circuitry 55 includes a display interface and a display device. The display interface converts data representing a display target to a video signal. The video signal is supplied to the display device. The display device displays the video signal representing the display target. For example, a CRT display, a liquid crystal display, an organic EL display, an LED display, a plasma display, or any other displays known in this technical field can be discretionarily applied as the display device.

The input circuitry 57 includes an input device and an input interface. The input device accepts various instructions from a user. A keyboard, a mouse, various types of switches, a touch screen, a touch pad, etc. can be usable as the input device. The input interface supplies an output signal from the input device to the processing circuitry 51 via a bus. The input circuitry 57 is not limited to circuitry that includes physical operation components such as a mouse and a keyboard. For example, the input circuitry may include electrical signal processing circuitry that receives an electrical signal corresponding to an input operation from an external input device provided separately from the magnetic resonance imaging apparatus 1, and outputs the received electrical signal to various circuitry.

The network IF 59 is an interface that connects the magnetic resonance imaging apparatus 1 to a work station, a Picture Archiving communication System (PACS), a Hospital Information System (HIS), and/or a Radiology Information System (RIS), etc. via a Local Area Network (LAN). The network IF performs transmission/reception of various information relative to the connected work station, PACS, HIS, and RIS.

The communication IF 61 is an interface that connects the host PC 50 to the sequence control circuitry 29 and the reception circuitry 25 by wiring or wirelessly. For example, the communication IF 61 transmits pulse sequence information to the sequence control circuitry 29. The communication IF 61 receives MR signals from the reception circuitry 25.

The configuration described above is an example, and the other configurations can be applied. For example, the sequence control circuitry 29 may be installed in the host PC 50. In addition, the sequence control circuitry 29 and the processing circuitry 51 may be implemented on the same substrate. The sequence control circuitry 29, the gradient field power supply 21, the transmission circuitry 23, and the reception circuitry 25 may be implemented on a single control apparatus different from the host PC 50, or may be separately implemented on a plurality of apparatuses.

Next, an example of the operation of the magnetic resonance imaging apparatus 1 according to the present embodiment will be explained. A method for filling k-space of MR imaging according to the present embodiment may be any method; however, it is assumed that the Cartesian method in which MR signal acquisition is performed for each phase encode line is adopted to explain the operation of the magnetic resonance imaging apparatus 1 in detail. In addition, the magnetic resonance imaging apparatus 1 according to the present embodiment typically executes the MRF sequence as an image acquisition sequence. MRF is a method for estimating a quantitative value which is a value of an MR parameter such as T1, T2, etc. In MRF, a quantitative value is estimated by dictionary matching between a signal value waveform of consecutive MR signals and a signal value waveform obtained by simulation (predictive calculation). MRF needs multiple times of signal acquisition by changing the imaging parameter to fill the k-space. In the Cartesian method, signal acquisition is repeated for each phase encode line.

In MRF, the MRF sequence has to be performed under the same conditions as the simulation conditions for simulation to obtain the predictive signal value waveform in order to perform comparison between a measured signal value waveform generated by the quantitative image generation function 515 and the predictive signal value waveform registered in the dictionary 531. Thus, it is preferred that the initial condition of longitudinal magnetization and transverse magnetization conforms in the simulation and the MRF sequence. In the following description, the initial condition of longitudinal magnetization and transverse magnetization for each phase encode line is referred to as an initial magnetization. In the Cartesian method, if signal acquisition is performed using multiple pulses for a phase encode line immediately after signal acquisition is performed for a previous phase encode line, the initial magnetization is different between phase encode lines, and between each phase encode line and simulation. However, it is difficult to reproduce a partial saturation state from a random magnetization state. Accordingly, it is practical to adopt a completely relaxed state (macroscopic longitudinal magnetization=1, macroscopic transverse magnetization=0) or a zero magnetization state from which the partial saturation state is relatively easy to be reproduced as the initial state of magnetization. In the following description, the state where the macroscopic longitudinal magnetization is 1, and the macroscopic transverse magnetization is 0 is referred to as a completely relaxed state.

Figure 2:
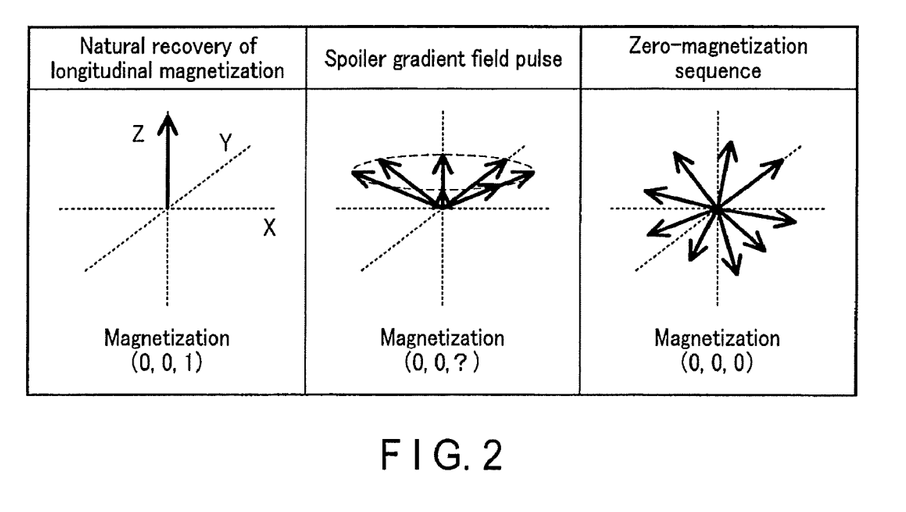
FIG. 2 illustrates the initial conditions of longitudinal magnetization and transverse magnetization for comparison.

FIG. 2 illustrates the initial conditions of longitudinal magnetization and transverse magnetization for comparison.

As shown in the left column of FIG. 2, a method of setting a waiting time for natural recovery of longitudinal magnetization for each phase encode line may be used for a method for recovering the longitudinal magnetization. In this method, the macroscopic magnetization in an XY plane (namely, transverse magnetization) can be reset to be zero, and the macroscopic magnetization in the Z axis direction (namely, longitudinal magnetization) can be reset to be one. That is, the completely relaxed state is accomplished. However, a long waiting time is necessary for longitudinal relaxation recovery. For example, in a case where the matrix size in the phase encode direction is 64, and the waiting time for each phase encode line is 5 seconds, the waiting time of 64*5 seconds, which is around 5.3 minutes, is necessary for the total imaging time. The imaging time is increased by providing such a waiting time, which causes an increase in stress to the subject P or a decrease of throughput of MR examination.

As shown in the middle column of FIG. 2, a method of applying spoiler gradient field pulses in a steady state for each phase encode line to disperse magnetization components of each proton within a voxel in the XY plane, and resetting the macroscopic transverse magnetization to zero may be used. In this method, the macroscopic transverse magnetization can be reset to zero with no waiting time. However, the macroscopic magnetization in the z axis direction (namely, longitudinal magnetization) cannot be set to zero, and the value of the macroscopic longitudinal magnetization is unknown. Accordingly, the MR signals acquired in the first phase encode line cannot be used for MRF. That is, for the pulse sequence that have less phase encode lines such as Echo Planner Imaging (EPI), a number of MR signals cannot be used.

As shown in the right column of FIG. 2, the sequence control circuitry 29 according to the present embodiment executes the zero-magnetization sequence. In the zero-magnetization sequence, the orientation of magnetization in each proton within the imaging area is dispersed in the three-dimensional direction in the XYZ space. Accordingly, the macroscopic longitudinal magnetization and transverse magnetization within the imaging area can be forcibly reset to zero for a short time.

Figure 3:
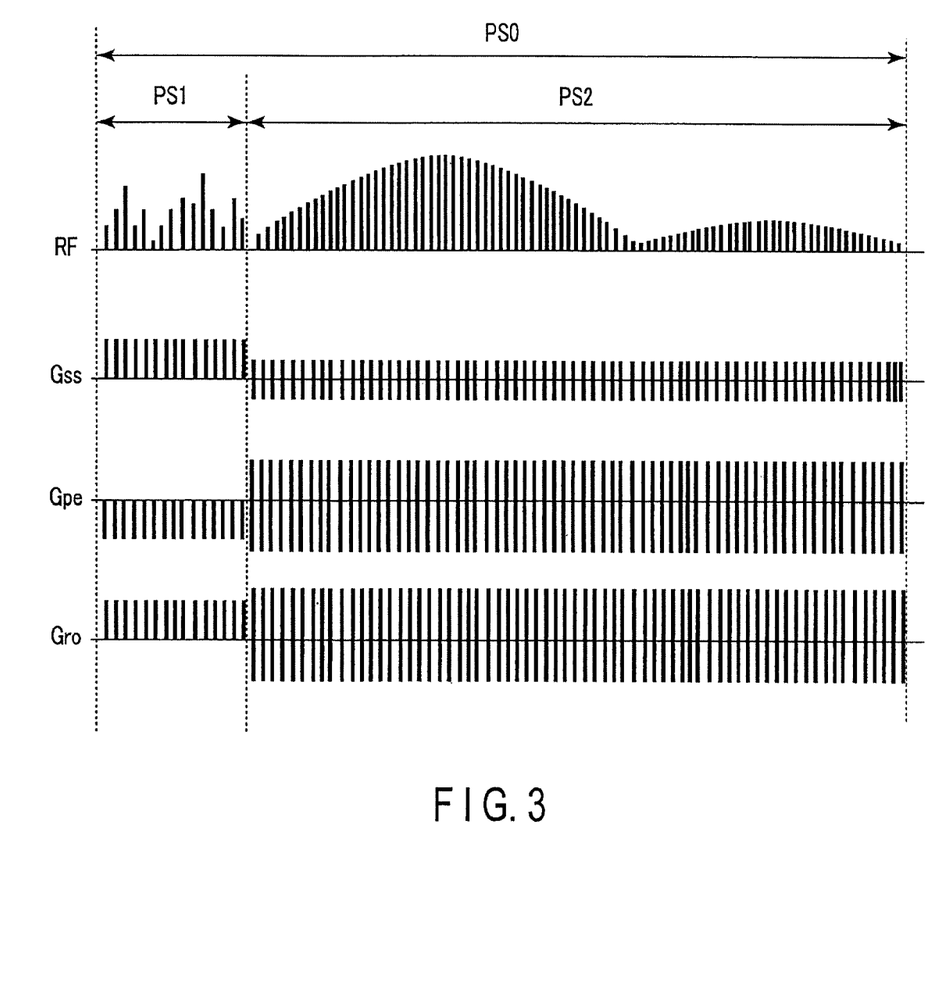
FIG. 3 illustrates an example of imaging sequence according to the present embodiment.

FIG. 3 illustrates an example of the imaging sequence PS0 according to the present embodiment. The imaging sequence PS0 shown in FIG. 3 is a pulse sequence of a phase encode line. The zero-magnetization sequence PS1 and the MRF sequence PS2 are alternately performed for each phase encode line. In other words, the imaging sequence PS0 has a segment for the zero-magnetization sequence PS1 and a segment for the MRF sequence PS2 for each phase encode line. The segment for the zero-magnetization sequence PS1 is provided before the segment for the MRF sequence PS2. It is assumed that the k-space filling method for the MRF sequence shown in FIG. 3 is the Cartesian method in which signal acquisition is performed for each phase encode line.

As shown in FIG. 3, in the zero-magnetization sequence PS1, the sequence control circuitry 29 synchronously controls the transmission circuitry 23 and the gradient field power supply 21 to apply a plurality of RF magnetic field pulses while changing the magnitude and the phase thereof and applying a plurality of spoiler gradient field pulses. The transmission circuitry 23 applies the RF magnetic field pulses while changing the magnitude and the phase thereof via the transmission coil 45 in accordance with control by the sequence control circuitry 29. The magnitude of the RF magnetic field pulse corresponds to an angle (flip angle) where the macroscopic magnetization collapses from the Z axis. The magnitude of the RF magnetic field pulse is defined by a product of an amplitude and an applied time of the RF magnetic field pulse. The phase of the RF magnetic field pulse corresponds to a direction where the macroscopic magnetization collapses (angle around the Z axis). The phase of the RF magnetic field pulse is defined by the ratio between the amplitude of the high frequency magnetic field from the real coil and the amplitude of the high frequency magnetic field from the imaginary coil. The sequence control circuitry 29 determines the magnitude and the phase of each RF magnetic field pulse based on a random function in accordance with a predetermined probability distribution. The magnitude and the phase of the RF magnetic field pulse is not necessarily to be arranged randomly, but may be arranged regularly if the macroscopic magnetization of each axis from a given magnetization state becomes sufficiently small by executing the zero-magnetization sequence PS1.

As shown in FIG. 3, in the zero-magnetization sequence PS1, the gradient field power supply 21 applies a plurality of spoiler gradient field pulses via the gradient field coil 43 in accordance with control by the sequence control circuitry 29. The spoiler gradient field pulses are applied relative to the X axis (readout gradient field Gro), the Y axis (phase encode gradient field Gpe), and the Z axis (slice selective gradient field Gss).

The zero-magnetization sequence is performed to decrease the macroscopic longitudinal magnetization and transverse magnetization in the spatial area including the imaging area of the MRF sequence. Accordingly, the frequency of the RF magnetic field pulse to be applied in the zero-magnetization sequence is set so that the RF magnetic field pulse to be applied in the zero-magnetization sequence can exit protons in the spatial area. If the RF magnetic field pulse having the frequency set as above is applied, the macroscopic longitudinal magnetization in each voxel within the imaging area collapses by an angle corresponding to the magnitude of the RF magnetic field pulse in the direction corresponding to the phase of the RF magnetic field pulse. If the spoiler gradient field pulse is applied, the macroscopic transverse magnetization in each voxel within the imaging area is erased. By applying the RF magnetic field pulses and applying the spoiler gradient field pulses while randomly changing the magnitude and the phase thereof, the orientation of magnetization in each proton within the imaging area can be three-dimensionally dispersed, and the macroscopic longitudinal magnetization and transverse magnetization in each voxel within the imaging area can be reset to approximately zero. In this method, the macroscopic longitudinal magnetization and transverse magnetization can be reset to approximately zero without being influenced by the high frequency magnetic field distribution (B1 distribution) caused by the transmission coil 45. By performing the zero-magnetization sequence, the macroscopic longitudinal magnetization and transverse magnetization can be reset to approximately zero at the time when the subsequently performed MRF sequence is initiated.

Figure 4:
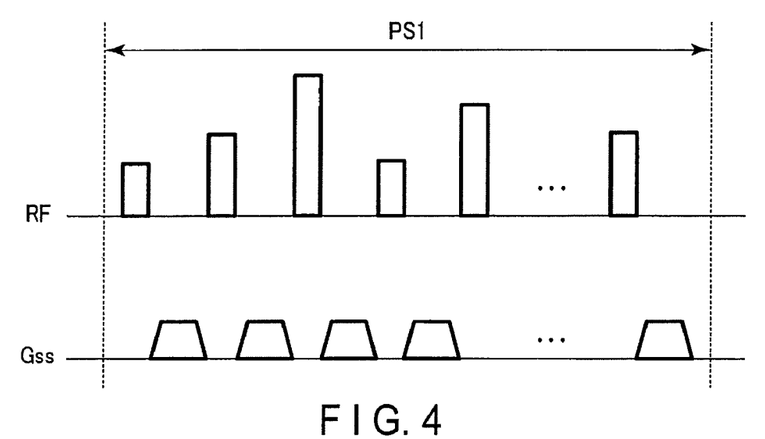
FIG. 4 illustrates the details of the zero-magnetization sequence included in the imaging sequence shown in FIG. 3.

FIG. 4 illustrates the detail of the zero-magnetization sequence PS1 included in the imaging sequence PS0 shown in FIG. 3. The pulse sequence in the Y axis Gpe and the X axis Gro is omitted. As shown in FIG. 4, the sequence control circuitry 29 synchronously controls the transmission circuitry 23 and the gradient field power supply 21 so that the RF magnetic field pulse and the spoiler gradient field pulse are applied alternately. The sequence control circuitry 29 applies the RF magnetic field pulse and the spoiler gradient field pulse alternately, without applying any other RF magnetic field pulse in-between for MR signal acquisition, etc. By applying the RF magnetic field pulse and the spoiler gradient field pulse alternately, the macroscopic longitudinal magnetization and transverse magnetization can be rapidly decreased.

The spoiler gradient field pulse is applied to the Z axis Gss, the Y axis Gpe, and the X axis Gro, and accordingly, the dispersion of macroscopic magnetization can be ensured and performed rapidly. The sequence control circuitry 29 may apply the spoiler gradient field pulse to only one or two axes among the Z axis Gss, the Y axis Gpe, and the X axis Gro. The magnitude of the spoiler gradient field pulse may be set to be the same value or different values for the three axes. The magnitude of each spoiler gradient field pulse may be the same or may vary during the zero-magnetization sequence PS1. As shown in FIG. 3, the polarity of the spoiler gradient field pulse magnitude is the same in the Z axis Gss and the X axis Gro, and the polarity of the spoiler gradient field pulse magnitude in the Z axis Gss and the X axis Gro is opposed to that in the Y axis Gpe. However, the polarity of the spoiler gradient field pulse may be the same in the three axes.

In the above explanation, the zero-magnetization sequence PS1 is performed to reset the macroscopic longitudinal magnetization and transverse magnetization in each voxel within the imaging area in the MRF sequence PS2 to approximately zero. However, it is not always necessary to reset the macroscopic longitudinal magnetization and transverse magnetization to approximately zero in the present embodiment. The zero-magnetization sequence PS1 is performed to conform the initial magnetization for each phase encode line after the zero-magnetization sequence PS1 to the initial magnetization of simulation. The setting value of the initial magnetization is not necessarily to be set so that the longitudinal magnetization equals zero, and the transverse magnetization equals zero, but may be a value lower than the value at the time when the zero-magnetization sequence PS1 is initiated, for example, the longitudinal magnetization is nearly zero, and the transverse magnetization is nearly zero. That is, if the macroscopic longitudinal magnetization and transverse magnetization can be conformed to the initial setting value by the zero-magnetization sequence PS1, it is sufficient if the macroscopic longitudinal magnetization and transverse magnetization can be decreased to the setting value from the value at the time of initiating the zero-magnetization sequence PS1. The setting value of the initial magnetization may be discretionarily set through the input circuitry 57, for example.

The time length of the zero-magnetization sequence PS1 may be discretionarily set to be shorter than the waiting time for longitudinal relaxation. For example, the time length of the zero-magnetization sequence PS1 is set to be one second or less. If the time length of the zero-magnetization sequence PS1 is one second, it is preferred that around 50 pulses of the RF magnetic field pulse and the spoiler gradient field pulse are each applied for the one second.

As shown in FIG. 3, the MRF sequence PS2 is performed subsequent to the zero-magnetization sequence PS1. The sequence control circuitry 29 may initiate the MRF sequence PS2 if a predetermined time has passed after the last spoiler gradient field pulse is applied in the zero-magnetization sequence PS1, or may initiate the MRF sequence PS2 immediately after the last spoiler gradient field pulse is applied in the zero-magnetization sequence PS1. In the MRF sequence PS2, the sequence control circuitry 29 synchronously controls the gradient field power supply 21, the transmission circuitry 23 and the reception circuitry 25 based on the pulse sequence information of the MRF sequence, and executes a predetermined MRF sequence. Specifically, the sequence control circuitry 29 acquires MR signals while pseudo-randomly changing at least one signal acquisition parameter such as a flip angle (magnitude) FA, a repetition time TR, or an echo time TE, etc. By this processing, a measured signal value waveform specific to a tissue can be acquired.

For example, a pulse sequence based on the Gradient Echo (GRE) sequence is constructed as the MRF sequence. In this case, the sequence control circuitry 29 applies the slice selective gradient field pulse having slice selectivity to excite a selected slice by the RF magnetic field pulse through the gradient field coil 43 by superimposing it to the application of each RF magnetic field pulse. By this processing, the magnetization collapses to the direction with a flip angle corresponding to the magnitude and the phase of the RF magnetic field pulse, and transverse magnetization is generated. After application of the RF magnetic field pulse and the slice selective gradient field pulse, the sequence control circuitry 29 applies a phase encode gradient field pulse having the magnitude corresponding to each phase encode line via the gradient field coil 43. After application of the phase encode gradient field pulse, the sequence control circuitry 29 receives MR signals via the reception coil 47 while applying a readout gradient field pulse Gro via the gradient field coil 43. The repetition time of the RF pulse is defined as a TR.

The magnitude and the phase of the RF magnetic field pulse used in the MRF sequence PS2 may be changed in any patterns. For example, as shown in FIG. 3, the sequence control circuitry 29 applies the RF magnetic field pulses so that the flip angle (magnitude) gradually changes from a lower value to a higher value from the starting point of the MRF sequence PS2 to a certain point within the MRF sequence PS2. Specifically, the flip angle gradually increases from approximately zero degrees to a predetermined maximum angle, and then decreases from the predetermined maximum angle to approximately zero degrees. Thereafter, the flip angle gradually increases from approximately zero degrees to a predetermined angle which is smaller than the predetermined maximum angle, and decreases from the predetermined angle to approximately zero degrees. At the time of initiating the MRF sequence, the signal value of MR signals are approximately zero since the longitudinal magnetization and the transverse magnetization are reset to approximately zero by the zero-magnetization sequence. During the MRF sequence, the signal value gradually becomes greater as the transverse magnetization is generated.

The zero-magnetization sequence PS1 is performed to erase the longitudinal magnetization and the transverse magnetization. Thus, the RF pulse and the spoiler gradient field pulse in the zero-magnetization sequence PS1 can be designed independently of the MRF sequence PS2. For example, in the imaging sequence using the Steady-State Free Precession (SSFP), the time interval between adjacent RF pulses in the transition period and the steady-state period (signal acquisition period) is set to be the same value. However, in the present embodiment, the time interval between adjacent RF pulses in the zero-magnetization sequence PS1 is not necessarily the same as the time interval between adjacent RF pulses in the MRF sequence PS2. In order to shorten the imaging sequence, it is preferred that the time interval between adjacent RF pulses in the zero-magnetization sequence PS1 is set to be shorter than the time interval between adjacent RF pulses in the MRF sequence PS2.

The aforementioned MRF sequence is assumed to be a pulse sequence based on the GRE sequence. However, the MRF sequence according to the present embodiment may be a Spin Echo (SE) sequence. In addition, either pulse sequence may include an Inversion Recovery (IR) pulse. The k-space filling method may adopt Echo Planar Imaging (EPI) instead of a method of filling for each phase encode line. The Cartesian method is adopted in the k-space filling in the above MRF sequence; however, the other techniques such as radial filling, in which signal acquisition is performed radially relative to the k-space, or spiral filling, in which signal acquisition is performed spirally relative to the k-space, can be adopted.

As stated above, according to the present embodiment, by applying the RF magnetic field pulses while changing the magnitude and the phase thereof and applying the spoiler gradient field pulses, the macroscopic longitudinal magnetization and transverse magnetization can be set to substantially zero with no longitudinal relaxation waiting time. For example, in a case where the matrix size in the phase direction is 64, the imaging time is 8.9 minutes in the MRF sequence with a longitudinal relaxation waiting time (TR=12 ms, the longitudinal relaxation waiting time=5 s). On the other hand, in the imaging sequence PS0 according to the present embodiment which adopts the zero-magnetization sequence PS1 (application time is 1 s) instead of the longitudinal relaxation waiting time, if MR signals are acquired immediately after the zero-magnetization sequence PS1, the imaging time is shortened to 3.8 minutes.

Next, generation of the dictionary 531 by the dictionary generation function 511 of the processing circuitry 51 according to the present embodiment will be described.

Figure 5:
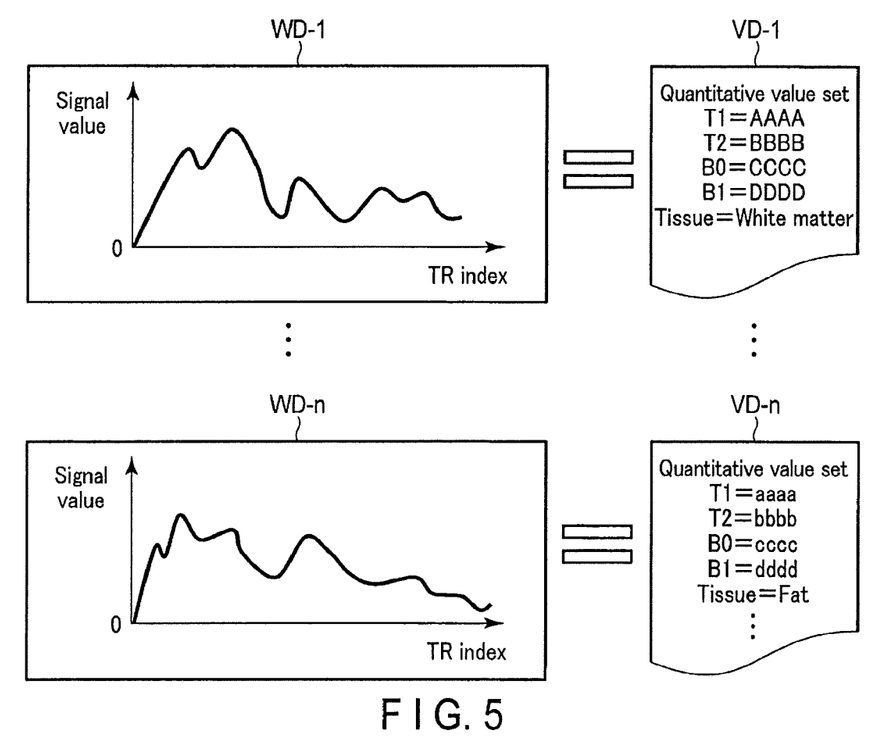
FIG. 5 is a schematic diagram of an example of a dictionary generated by a dictionary generation function of the processing circuitry shown in FIG. 1.

FIG. 5 is a schematic diagram of an example of the dictionary 531 generated by the dictionary generation function 511 of processing circuitry 51. As shown in FIG. 5, the dictionary 531 includes data in which a predictive signal value waveform WD-n is associated with each of the set of quantitative values of multiple types of MR parameters (hereinafter referred to as a quantitative value set) VD-n. The number of combinations of the quantitative value set VD and the predictive signal value waveform WD is represented by "n". The number of combinations n is the same as the number of the combinations of quantitative values of multiple types of MR parameters that constitute the quantitative value sets VDs. The MR parameters depend on a target substance of the MR imaging and the imaging environment surrounding the target substance. The MR parameters include, for example, longitudinal relaxation time T1, transverse relaxation time T2, static magnetic field B0, RF transmission magnetic field B1, and a type of tissue. The predictive signal value waveform WD-n is a signal value of MR signals for each TR index. The MR signal used for generating the predictive signal value waveform WD-n is a complex signal. The TR index in the predictive signal value waveform WD-n indicates the temporal order of TRs. For example, the quantitative value set VD-1 is associated with the predictive signal value waveform WD-1. For the quantitative value set VD-1, the quantitative value of T1 is "AAAA", the quantitative value of T2 is "BBBB", the quantitative value of B0 is "CCCC", the quantitative value of B1 is "DDDD", and the tissue is "white matter". In the following description, in a case where the number of combinations n is not focused on, the predictive signal value waveform WD-n and the quantitative value set VD-n are simply referred to as "predictive signal value waveform WD" and "quantitative value set VD", respectively.

The predictive signal value waveform WD is generated by a simulation in which Bloch equations are applied to the corresponding quantitative value set VD. The Bloch equations are a set of equations that describe motions of macroscopic magnetization and relaxation phenomenon. The Bloch equations can use the pulse sequence, or MR parameters such as the longitudinal relaxation time T1 and the transverse relaxation time T2. By solving the Bloch equations by using the MRF sequence, the initial conditions of longitudinal magnetization and transverse magnetization, and MR parameters of an estimation target, the time development of the signal value of the MR signals acquired by the MRF sequence can be theoretically calculated. In the above description, simulation using the Bloch equations is explained; however, the predictive signal value waveform WD may be generated by simulation using any other methods such as an Extended Phase Graph (EPG) algorithm. The EPG algorithm is an approach to artificially deal with multiple magnetizations, and is effective for a case where the pulse sequence includes a spoiler gradient field pulse, etc. as the MRF sequence PS2.

In the present embodiment, the zero-magnetization sequence PS1 to erase the longitudinal magnetization and the transverse magnetization is performed prior to the MRF sequence PS2. Accordingly, the initial condition for the Bloch equations can be set to the condition where the longitudinal magnetization and the transverse magnetization are zero. By the dictionary generation function 511, the processing circuitry 51 generates the predictive signal value waveform WD by solving the Bloch equations under such an initial condition. The value of transverse magnetization when the TR index is an "initial time" or zero influences the signal value of the predictive signal value waveform when the TR index=initial time. That is, if the transverse magnetization is zero when the TR index=initial time, the signal value of the predictive signal value waveform when the TR index=initial time is zero, as shown in FIG. 5. The value of longitudinal magnetization when the TR index is "initial time" influences the inclination of the predictive signal value waveform from when the TR index=initial time. If the longitudinal magnetization is zero when the TR index=initial time, the rising inclination of the predictive signal value waveform is steep in comparison with the case where the longitudinal magnetization is not zero.

It is preferred that the pulse sequence used in simulation is the same as the MRF sequence. That is, in a case where the MRF sequence PS2 shown in FIG. 3 is executed for MR signal acquisition of the subject P, simulation is performed based on the same pulse sequence as the MRF sequence PS2. By the dictionary generation function 511, the processing circuitry 51 randomly determines the magnitude and the phase of each RF magnetic field pulse used for the simulation in accordance with a predetermined probability distribution, in a manner similar to the sequence control circuitry 29. In a case where the magnitude and the phase of each RF magnetic field pulse used for the simulation are determined in advance, the magnitude and the phase of each RF magnetic field pulse used for the simulation can be used as the magnitude and the phase of each RF magnetic field pulse used in the zero-magnetization, sequence. In contrast, in a case where the magnitude and the phase of each RF magnetic field pulse used in the zero-magnetization sequence are determined in advance, the magnitude and the phase of each RF magnetic field pulse used in the zero-magnetization sequence can be used as the magnitude and the phase of each RF magnetic field pulse used for the simulation.

As stated above, in the present embodiment, since the zero-magnetization sequence PS1 is performed prior to the MRF sequence PS2, the initial condition for simulation for generating the predictive signal value waveform WD and the initial condition of the actual MRF sequence PS2 can conform to the condition in which the longitudinal magnetization and the transverse magnetization are zero. Accordingly, the motion of macroscopic magnetization in each voxel in the MRF sequence can be simply and accurately simulated.

Figure 6:
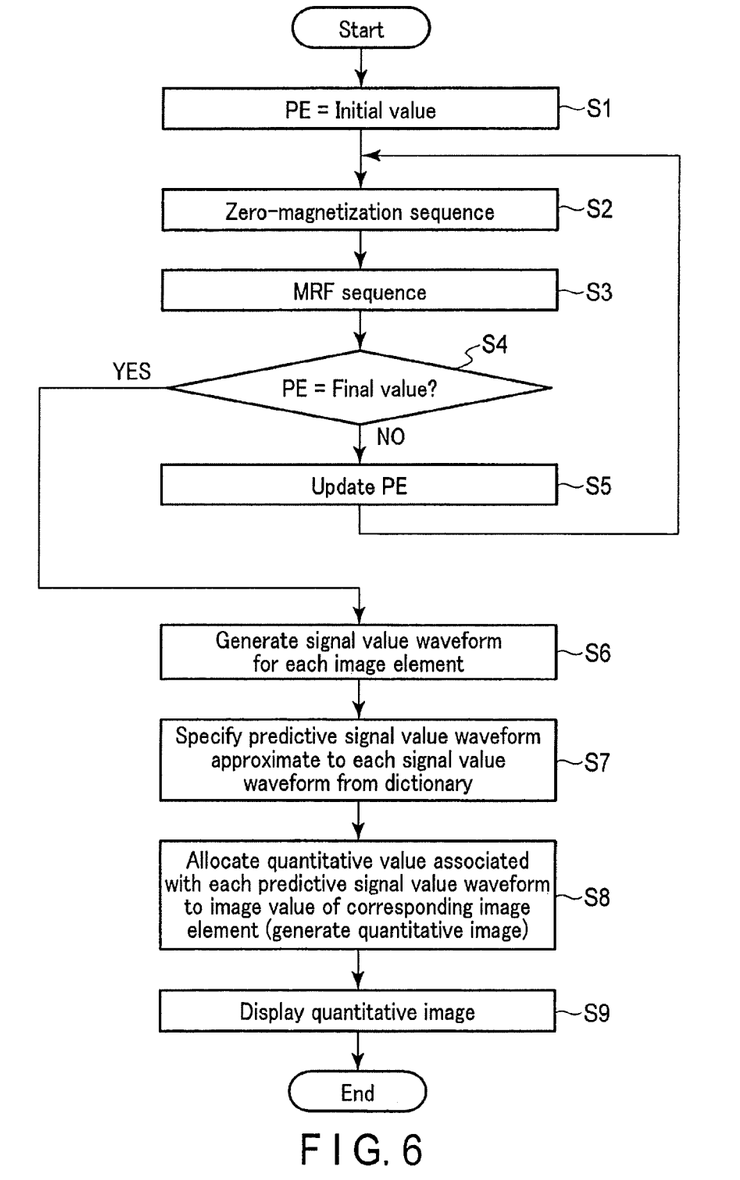
FIG. 6 is a flowchart of typical MR imaging using MRF according to the present embodiment under control by the processing circuitry shown in FIG. 1.

FIG. 6 is a flowchart of typical MR imaging using MRF according to the present embodiment under control by the processing circuitry 51. It is assumed that the k-space filling method according to the present embodiment is the Cartesian method in which MR signal acquisition is performed for each phase encode line.

If an instruction for initiating MR imaging is input by the user through the input circuitry 57, etc., the processing circuitry 51 sets the phase encode line to be the initial value (step S1), as shown in FIG. 6. The initial value can be discretionarily set in accordance with the k-space filling method. For example, if the k-space is filled with MR signals from the periphery, the initial value is set to be an upper limit or a lower limit of the number of steps in the phase encode direction, and if the k-space is filled with MR signals from the center, the initial value is set to be zero.

After step S1, the processing circuitry 51 directs the sequence control circuitry 29 to perform the zero-magnetization sequence (step S2). At step S2, the sequence control circuitry 29 synchronously controls the gradient field power supply 21 and the transmission circuitry 23, based on the pulse sequence information of the zero-magnetization sequence to apply RF magnetic field pulses while randomly changing the magnitude and the phase thereof and applying spoiler gradient field pulses. The sequence control circuitry 29 may determine the magnitude and the phase of the RF magnetic field pulses during performing the zero-magnetization sequence in real-time, or before performing the zero-magnetization sequence. As explained above, the magnitude and the phase of the RF magnetic field pulses are randomly determined in accordance with a predetermined probability distribution. By executing the zero-magnetization sequence, the macroscopic longitudinal magnetization and transverse magnetization in each voxel is erased.

After step S2, the processing circuitry 51 directs the sequence control circuitry 29 to perform the MRF sequence (step S3). At step S3, the sequence control circuitry 29 synchronously controls the gradient field power supply 21, the transmission circuitry 23, and the reception circuitry 25, based on the pulse sequence information of the MRF sequence, and executes a predetermined MRF sequence. The reception circuitry 25 acquires MR signals generated by each RF magnetic field pulse in the MRF sequence. The MRF signals acquired by the reception circuitry 25 are transmitted to the host PC 50. The processing circuitry 51 fills the transmitted MR signals in the k-space generated for each TR index, in accordance with the K-space filling method for the MRF sequence.

At step S3, the processing circuitry 51 determines whether the phase encode line indicates a final value (step S4).

At step S4, it is determined that the phase encode line does not indicate the final value (step S4: No), the processing circuitry 51 updates the phase encode line (step S5). Thereafter, the processing circuitry 51 sequentially performs the zero-magnetization sequence again at step S2 and the MRF sequence at step S3 in the updated phase encode line. Steps S3, S4, and S5 are repeated until the zero-magnetization sequence at step S2 and the MRF sequence at step S3 are performed in the phase encode line indicating the final value.

At step S4, it is determined that the phase encode line indicates the final value (step S4: Yes), and the processing circuitry 51 executes the quantitative image generation function 515 (steps S6, S7 and S8).

By the quantitative image generation function 515, the processing circuitry 51 first generates a measured signal value waveform based on the MR signals acquired by the MRF sequence for each image element (step S6).

Figure 7A:
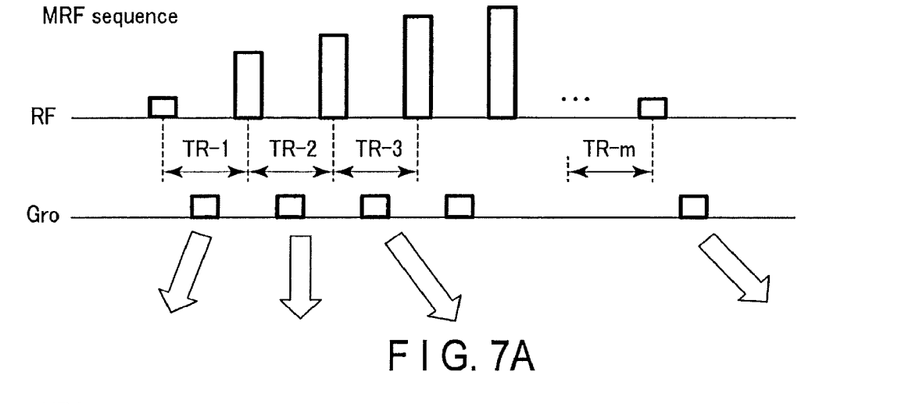
FIG. 7A is a diagram of an MRF sequence for MR signals that are acquired in the process of generating a measured signal value waveform at step S6 shown in FIG. 6.
Figure 7B:
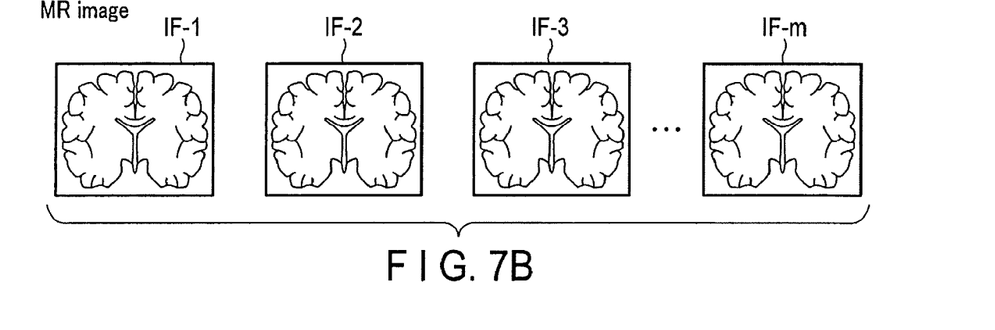
FIG. 7B is a series of MR image IFs for the respective TR indices in FIG. 7A.
Figure 7C:
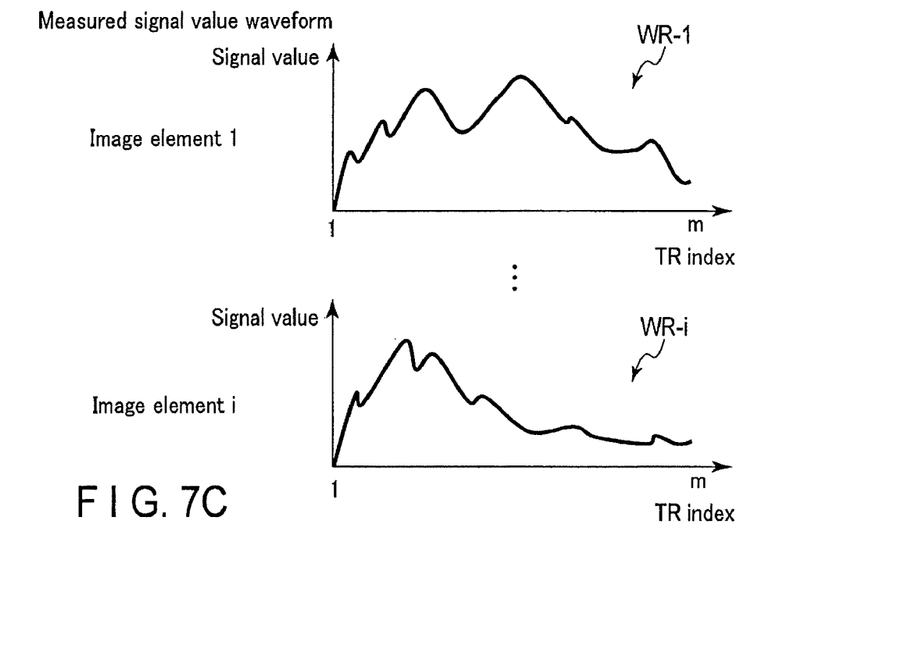
FIG. 7C is a measured signal value waveform WR-i for an image element i included in each MR image shown in FIG. 7B.

FIGS. 7A, 7B, and 7C show the process of generating a measured signal value waveform at step S6. As shown in FIG. 7A, MR signals are acquired by the reception circuitry 25 in each of the TRs in the MRF sequence. The reception circuitry 25 associates MR signals to a TR index. A TR index indicates the number of TRs in a phase encode line. Specifically, the first TR in the kth phase encode line and the first TR in the (k+1)th phase encode line are associated with the same TR index. In FIGS. 7A, 7B, and 7C, it is assumed that the number of TR indices is m. If MR signals are acquired, the processing circuitry 51 executes the image reconstruction function 513.

By executing the image reconstruction function 513, the processing circuitry 51 generates k-space data by arranging MR signals acquired in each phase encode line to the k-space generated for each TR index. Next, as shown in FIG. 7B, the processing circuitry 51 reconstructs an MR image IF by performing a two-dimensional inverse Fourier transform to the k-space data for each TR index. The MR image IF is generated for each TR index. Accordingly, m frames of MR images IFs are generated if the number of TR indices is m. The processing circuitry 51 may generate a phase image or a magnitude image as an MR image IF, based on complex signals which are MR signals.

Next, as shown in FIG. 7C, by the quantitative image generation function 515, the processing circuitry 51 generates a plurality of measured signal value waveforms WR-i for a plurality of image elements i based on a plurality of MR images for a plurality of TR indices. The MR image IF includes i image elements. Accordingly, the number of measured signal value waveforms WRs to be generated is the same as the number of image elements of the MR image IF, which is i. The detailed generation procedure will be described below. First, the processing circuitry 51 specifies an image element value of image element i in the same coordinate for each MR image IF, i.e., for each TR index. The measured signal value waveform WR-i is generated as a one-dimensional signal in which the image element values of each image element i are arranged in the order of TR indices. The measured signal value waveform WR-i which is associated with the TR index TR-m is stored in the storage circuitry 53.

After step S6, the processing circuitry 51 specifies a predictive signal value waveform which is approximate to the measured signal value waveform WR-i of each image element from the dictionary 531 (step S7).

Figure 8:
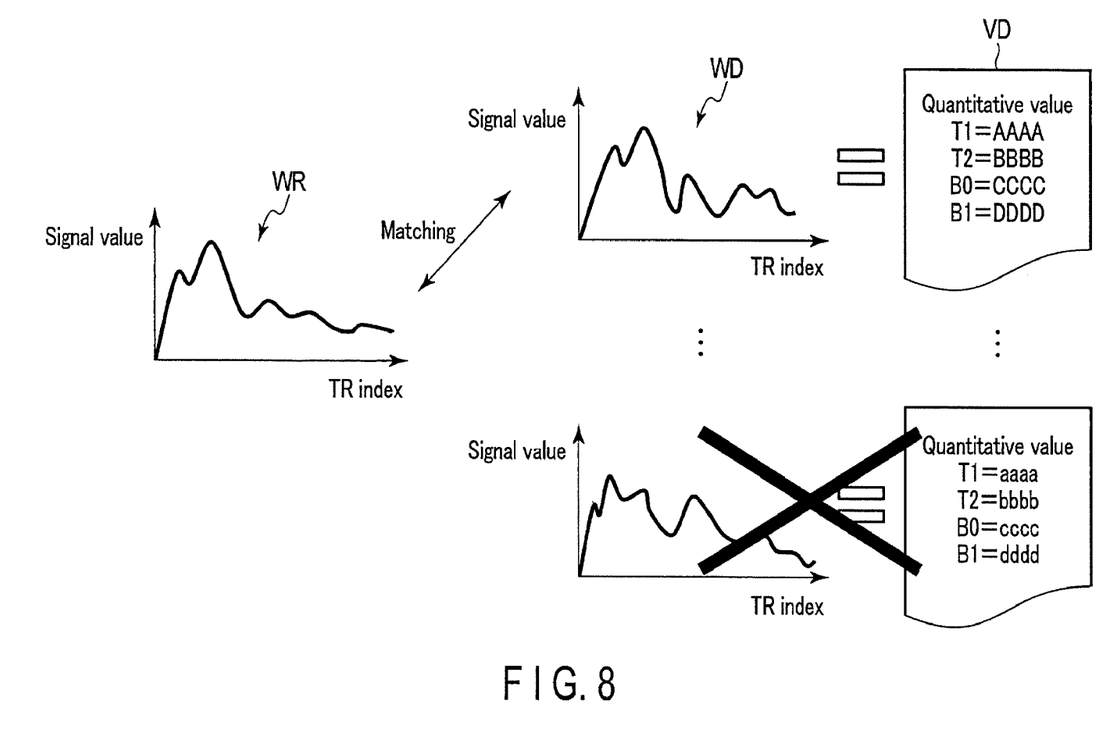
FIG. 8 is a schematic diagram of the process of specifying a predictive signal value waveform at step S7 shown in FIG. 6.

FIG. 8 is a schematic diagram of the process of specifying a predictive signal value waveform WD at step S7. As shown in FIG. 8, the processing circuitry 51 compares the measured signal value waveform WR generated at step S6 with a plurality of predictive signal value waveforms WDs registered in the dictionary 531, and specifies a predictive signal value waveform WD which is the most approximate to the measured signal value waveform WR in waveform, for each image element i. For example, the processing circuitry 51 performs template matching between the measured signal value waveform WR and all of the predictive signal value waveforms WDs registered in the dictionary 531, and calculates a correlation value. In this case, an inner product of complex signals of the measured signal value waveform WR and the predictive signal value waveform WD can be used as an index of similarity in the matching. The processing circuitry 51 specifies a predictive signal value waveform WD having the highest correlation value among all the predictive signal value waveforms WDs registered in the dictionary 531 as a predictive signal value waveform that is the most approximate to the measured signal value waveform WR.

After step S7, the processing circuitry 51 generates a quantitative image based on the quantitative values associated in the dictionary 531 with the predictive signal value waveform specified at step S7 (step S8). Specifically, at step S8, the processing circuitry 51 specifies a quantitative value set VD associated in the dictionary 531 with the predictive signal value waveform specified at step S7, for each image element i, as shown in FIG. 8. If the quantitative value set VD includes multiple types of MR parameters, the processing circuitry 51 specifies a quantitative value of an MR parameter to be estimated among the multiple types of MR parameters. The MR parameter to be estimated may be designated by the user through the input circuitry 57 or may be automatically set in accordance with a target of examination, an examination protocol, etc. In FIG. 8, if the MR parameter to be estimated is T1, T1 value of "AAAA" is specified as a quantitative value. The processing circuitry 51 allocates the specified quantitative value to an image element value of the corresponding image element i. The quantitative value is allocated to each image element i, in this manner, to generate a quantitative image which represents the spatial distribution of quantitative values.

After step S8, the processing circuitry 51 directs the display circuitry 55 to perform display processing (step S9). At step S9, the display circuitry 55 displays the quantitative image generated at step S8. The user can recognize the spatial distribution of the quantitative values of the MR parameter to be estimated by observing the quantitative image.

The operation of MR imaging according to the present embodiment is completed in the above processing.

The zero-magnetization sequence according to the present embodiment is performed prior to the signal acquisition sequence such as the MRF sequence, etc., in order to set the macroscopic longitudinal magnetization and transverse magnetization to substantially zero at the time of initiating the signal acquisition sequence. However, the purpose of the zero-magnetization sequence is not limited thereto, and the zero-magnetization sequence may be used for any purposes which relate to setting the macroscopic longitudinal magnetization and transverse magnetization to approximately zero. For example, the zero-magnetization sequence can be used as a Saturation Recovery (SR) technique. The SR technique is an imaging technique for image acquisition using fat suppression. The SR technique is a technique to perform a discretionary signal acquisition sequence such as an SE sequence, a GRE sequence, etc., after application of a 90° RF pulse to erase the longitudinal magnetization, and to acquire MR signals in which fat is suppressed. The sequence control circuitry 29 according to the present embodiment can perform the zero-magnetization sequence instead of application of a 90° RF pulse to erase the longitudinal magnetization.

As explained above, the magnetic resonance imaging apparatus according to the present embodiment includes at least the sequence control circuitry 29. The sequence control circuitry 29 performs the zero-magnetization sequence in which multiple RF magnetic field pulses are applied while changing the magnitude and/or the phrase thereof to the subject P and multiple spoiler gradient field pulses are applied to the subject P, in order to reduce the longitudinal magnetization and transverse magnetization, prior to the signal acquisition sequence for MR signal acquisition.

With this feature, the sequence control circuitry 29 can generate a predetermined initial magnetization at the time of initiating the signal acquisition sequence without providing a long waiting time required to achieve a completely relaxed state. For example, in the case where the MRF sequence that requires multiple times of signal acquisition to fill the k-space is adopted as the signal acquisition sequence, execution of the zero-magnetization sequence prior to the MRF sequence can eliminate a long waiting time to achieve a predetermined initial magnetization (for example, the macroscopic longitudinal magnetization is zero, and the macroscopic transverse magnetization is zero) at the time of initiating the MRF sequence. If the initial magnetization for simulation to generate the dictionary 531 is set to be zero, the initial magnetization of the MRF sequence can be correctly conformed to the initial magnetization for the simulation to generate the dictionary 531. Therefore, the magnetic resonance imaging apparatus according to the present embodiment can improve estimation accuracy of the quantitative value of the MR parameter.

In addition, in the spoiler gradient field technique shown in the middle of FIG. 2, the longitudinal magnetization cannot be controlled. Thus, if an additional RF magnetic field pulse such as a navigator echo or a waiting time for longitudinal magnetization relaxation is included in the pulse sequence, a dictionary has to be prepared, taking the added RF magnetic field pulse or waiting time into consideration. In contrast, in the zero-magnetization sequence according to the present embodiment, the longitudinal magnetization and the transverse magnetization can be set to zero for each phase encode line, and accordingly, an additional RF magnetic field pulse such as a navigator echo or a waiting time for longitudinal magnetization relaxation can be easily included.

Figure 9:
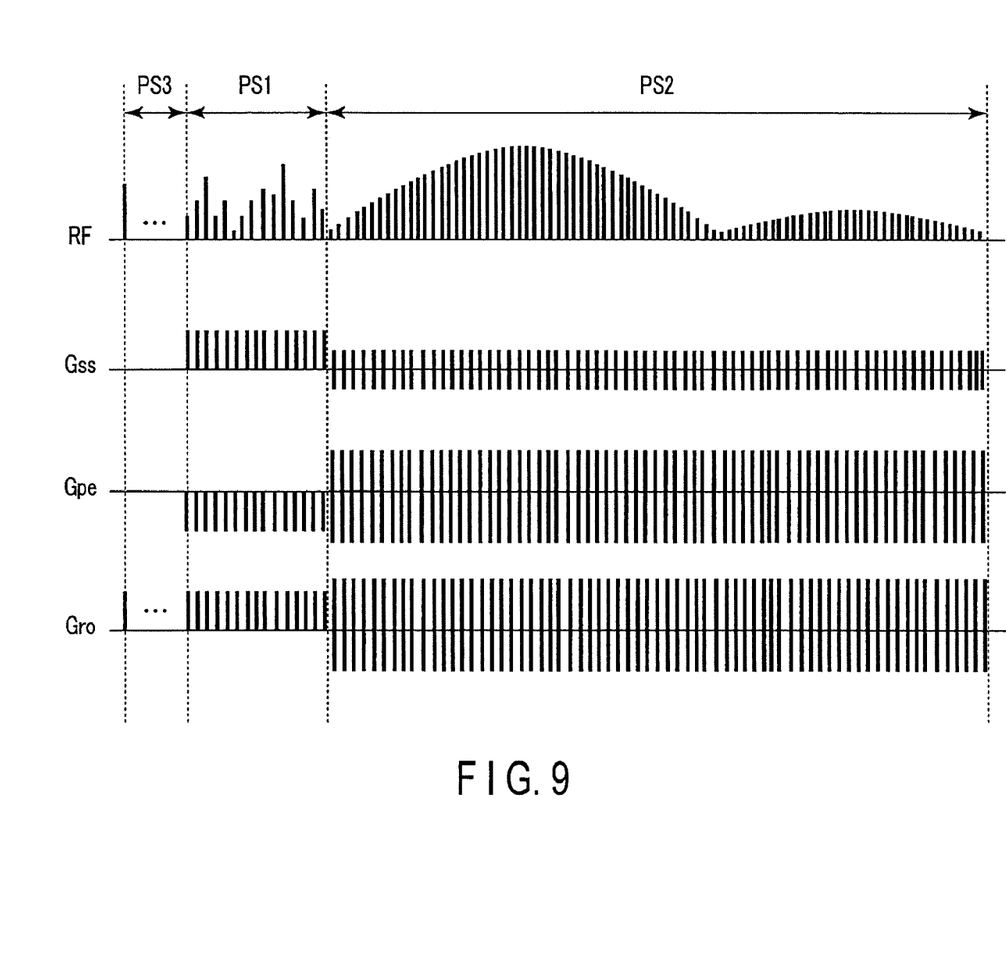
FIG. 9 illustrates an example of an imaging sequence of navigator-echo-based respiratory gating imaging according to the present embodiment.

FIG. 9 illustrates an example of an imaging sequence of navigator-echo-based respiratory gating imaging according to the present embodiment. In the imaging sequence shown in FIG. 9, a navigator sequence PS3 is performed prior to the zero-magnetization sequence PS1. In the navigator sequence PS3, the sequence control circuitry 29 synchronously controls the transmission circuitry 23 and the reception circuitry 25 to apply an RF pulse (navigator echo) for exciting a tracking target and a read-out gradient field pulse for acquiring MR signals generated due to the navigator echo. The tracking target is set to be an anatomical portion such as diaphragm which changes the position according to breathing and is clear in contrast. The navigator echo and the read-out gradient field pulse are repeatedly applied in the navigator sequence PS3 for monitoring the tracking target. The time length of the navigator sequence PS3 can be discretionarily set by the user through the input circuitry 57.

The navigator sequence PS3 is not limited to the pulse sequence as shown in FIG. 9. For example, the slice selective gradient field pulse Gss or the phase encode gradient field pulse Gpe, etc. can be further added to limit the excitation area by the navigator echo.

The sequence control circuitry 29 synchronously controls the gradient field power supply 21 and the transmission circuitry 23 to perform the zero-magnetization sequence upon completion of the navigator sequence PS3. Thereafter, the sequence control circuitry 29 synchronously controls the gradient field power supply 21, the transmission circuitry 23, and the reception circuitry 25 to perform the MRF sequence PS2 upon completion of the zero-magnetization sequence PS1. By this processing, the reception circuitry 25 receives MR signals from the subject P.

On the other hand, the MR signals acquired repeatedly by the reception circuitry 25 in the navigator sequence PS3 are transmitted to the host PC 50. The processing circuitry 51 generates a temporal signal value distribution based on the signal values of the repeatedly acquired MR signals. The temporal signal distribution represents a change of the diaphragm which is the tracking target in the Z axis direction. The processing circuitry 51 corrects a phase shift in accordance with respiratory motion of MR signals acquired in the MRF sequence PS2 by using the temporal signal value distribution generated in the navigator sequence PS3. The processing circuitry 51 executes steps S6, S7, and S8 shown in FIG. 6 relative to the corrected MR signals to generate a quantitative image. By this process, the highly accurate quantitative image not influenced by respiratory motion is generated.

As explained above, the zero-magnetization sequence PS1 is performed after the completion of the navigator sequence PS3 so that the sequence control circuitry 29 can forcibly erase the residual longitudinal magnetization and transverse magnetization generated by the navigator echo. Therefore, the magnetic resonance imaging apparatus according to the present embodiment can set the initial magnetization to be substantially zero at the time of initiating the MRF sequence PS2. Accordingly, even if the navigator echo is adopted, the initial state of magnetization in the MRF sequence PS2 can be conformed to the initial state of magnetization for simulation. The magnetic resonance imaging apparatus according to the present embodiment can eliminate the need to generate a dictionary that takes an influence of magnetization due to the navigator echo into consideration, and accordingly, can execute MRF simply and at low cost by using the navigator echo technique.

The temporal signal value distribution for the tracking target such as a diaphragm calculated by the processing circuitry 51 is not limited to be used for phase correction. For example, the sequence control circuitry 29 may control a slice to track the imaging target area in real-time based on the temporal signal distribution, in the MRF sequence PS2.

In addition, the sequence control circuitry 29 according to the present embodiment may perform the zero-magnetization sequence upon receiving a trigger signal of cardiac or respiratory gating for each phase encode line, and perform the MRF sequence upon completion of the zero-magnetization sequence. By this processing, the initial magnetization can be set to be approximately zero at the time of initiating the MRF sequence for each phase encode line in the gated imaging using irregularly generated trigger signals, and accordingly, the MRF sequence can be applied to the gated imaging.

According to at least one of the aforementioned embodiments, a predetermined initial magnetization can be achieved without providing a long waiting time.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
sequence control circuitry configured to control execution of a pulse sequence which includes a first segment and a second segment being provided prior to the first segment, the first segment being where signal acquisition is performed, the second segment being where an orientation of each proton within an imaging area being three-dimensionally dispersed and macroscopic longitudinal magnetization and transverse magnetization are reduced to substantially zero by applying a plurality of RF magnetic field pulses while changing a magnitude and/or a phase thereof and a plurality of spoiler gradient field pulses; and
processing circuitry configured to generate an image based on signals acquired by the pulse sequence.

2. The magnetic resonance imaging apparatus according to claim 1, wherein the pulse sequence includes the second segment prior to the first segment for each phase encode line.

3. The magnetic resonance imaging apparatus according to claim 1, wherein the sequence control circuitry applies the plurality of RF magnetic field pulses while randomly changing the magnitude and the phase thereof in the second segment.

4. The magnetic resonance imaging apparatus according to claim 1, wherein the sequence control circuitry applies the RF magnetic field pulses and the spoiler gradient field pulses alternately without any other pulses being added in-between in the second segment.

5. The magnetic resonance imaging apparatus according to claim 1, wherein the second segment is provided to set the longitudinal magnetization and the transverse magnetization to be approximately zero.

6. The magnetic resonance imaging apparatus according to claim 1, wherein the sequence control circuitry executes a pulse sequence for MRF in the first segment.

7. The magnetic resonance imaging apparatus according to claim 6, further comprising storage circuitry configured to store a dictionary in which a plurality of quantitative values are respectively associated with a plurality of predictive signal value waveforms obtained by simulation performed based on each of the plurality of quantitative values,
wherein the processing circuitry is configured to generate an image relating to the quantitative values by performing matching between a signal value waveform based on MR signals acquired by the pulse sequence for the MRF and the dictionary.

8. The magnetic resonance imaging apparatus according to claim 7, wherein the plurality of predictive signal value waveforms are obtained by simulation based on a condition where an initial value of longitudinal magnetization and transverse magnetization is zero.

9. The magnetic resonance imaging apparatus according to claim 1, wherein the sequence control circuitry applies the plurality of RF magnetic field pulses while changing the magnitude to gradually increase from zero from a starting point of the second segment to a predetermined point of the first segment.

10. The magnetic resonance imaging apparatus according to claim 1, wherein the second segment is provided after application of a navigator echo, and the first segment is provided subsequent to the second segment.

* * * * *